United States Patent
Huang et al.

(10) Patent No.: US 9,507,261 B2
(45) Date of Patent: Nov. 29, 2016

(54) PHOTOSENSITIVE COMPOSITION, PROTECTIVE FILM, AND ELEMENT HAVING THE PROTECTIVE FILM

(71) Applicant: Chi Mei Corporation, Tainan (TW)

(72) Inventors: Wei-Jie Huang, Taipei (TW); Chun-An Shih, Tainan (TW)

(73) Assignee: Chi Mei Corporation, Tainan (TW)

( * ) Notice: Subject to any disclaimer, the term of this patent is extended or adjusted under 35 U.S.C. 154(b) by 0 days.

(21) Appl. No.: 14/700,157

(22) Filed: Apr. 30, 2015

(65) Prior Publication Data

US 2015/0323868 A1    Nov. 12, 2015

(30) Foreign Application Priority Data

May 7, 2014 (TW) .............................. 103116256 A

(51) Int. Cl.
   *G03F 7/022* (2006.01)
   *G03F 7/075* (2006.01)
   *C09D 183/06* (2006.01)
   *C08G 77/14* (2006.01)

(52) U.S. Cl.
   CPC ............ *G03F 7/022* (2013.01); *C09D 183/06* (2013.01); *G03F 7/0757* (2013.01); *C08G 77/14* (2013.01)

(58) Field of Classification Search
   CPC .................................................. G03F 7/0757
   See application file for complete search history.

(56) References Cited

U.S. PATENT DOCUMENTS

2003/0211407 A1    11/2003    Watanabe et al.
2005/0266344 A1*   12/2005    Sakurai ................ G03F 7/0045
                                                     430/270.1
2011/0048787 A1*   3/2011     Allen .................... C09D 183/04
                                                     174/262
2012/0141936 A1*   6/2012     Wu ......................... G03F 7/40
                                                     430/270.1

FOREIGN PATENT DOCUMENTS

| JP | H03-059667 | 3/1991 |
|---|---|---|
| JP | H07-098502 | 4/1995 |
| JP | H10153854 | 6/1998 |
| JP | 2001281853 | 10/2001 |
| TW | 201224645 | 6/2012 |
| TW | 201245889 | 11/2012 |

OTHER PUBLICATIONS

"Office Action of Taiwan Counterpart Application", issued on Jun. 3, 2015, p. 1-p. 4.

* cited by examiner

*Primary Examiner* — Cynthia Hamilton
(74) *Attorney, Agent, or Firm* — Jianq Chyun IP Office

(57) ABSTRACT

A photosensitive composition, a protective film, and an element having the protective film are provided. The photosensitive composition includes a polysiloxane (A), an o-naphthoquinonediazidesulfonate (B), and a solvent (C). The polysiloxane (A) is obtained by polycondensing a mixture, wherein the mixture includes a silane monomer (a-1) represented by formula (1), a silane monomer (a-2) represented by formula (2), and a silicon-containing compound (a-3). The silicon-containing compound (a-3) is selected from the group consisting of a silane monomer represented by formula (3), a siloxane prepolymer, and a silica particle. The photosensitive composition can be made into a protective film with excellent chemical resistance.

$(R^1O)_3Si-R^2-Si(OR^3)_3$   formula (1)

$Si(R^4)_b(OR^5)_{4-b}$   formula (2)

$Si(R^6)_c(OR^7)_{4-c}$   formula (3)

4 Claims, No Drawings

PHOTOSENSITIVE COMPOSITION, PROTECTIVE FILM, AND ELEMENT HAVING THE PROTECTIVE FILM

CROSS-REFERENCE TO RELATED APPLICATION

This application claims the priority benefit of Taiwan application serial no. 103116256, filed on May 7, 2014. The entirety of the above-mentioned patent application is hereby incorporated by reference herein and made a part of this specification.

BACKGROUND OF THE INVENTION

Field of the Invention

The invention relates to a photosensitive composition, a protective film, and an element having the protective film. More particularly, the invention relates to a photosensitive composition that can be made into a protective film having good chemical resistance, a protective film formed thereby, and an element having the protective film.

Description of Related Art

In recent years, with the development of the semiconductor industry, liquid crystal displays (LCDs), and organic electro-luminescence displays (OLEDs), and the resulting demand for size reduction, the photolithography process has become a very important topic. In the photolithography process, the desired pattern needs to be finer so as to achieve the goal of size reduction. In general, the finer pattern is formed by performing exposure and development on a positive photosensitive composition having high resolution and high photosensitivity. It should be mentioned that, polysiloxane is generally the main component of the positive photosensitive composition.

In general, the material used as a protective film (such as a planarized film or a cured film) needs to have high heat resistance, high transparency, and high dielectric constant at the same time. Japanese Patent Publication No. 7-98502 discloses a composition containing a novolac resin and a quinone diazide compound. Japanese Unexamined Patent Publication No. 10-153854 and Japanese Laid-Open No. 2001-281853 disclose a composition containing an acrylic resin and a quinone diazide compound. However, the heat resistance of the materials is insufficient, and since the cured film is colored due to the high-temperature treatment of the substrate, the issue of reduced transparency exists.

Moreover, a siloxane polymer is generally used as the material having high heat resistance, high transparency, and high dielectric constant. A quinone diazide compound is formed to provide photosensitivity to the siloxane polymer. For instance, U.S. Patent Application Publication No. 2003-211407 discloses a composition formed by a phenolic hydroxy group-terminated siloxane polymer and a quinone diazide compound; and Japanese Unexamined Patent Publication No. 3-59667 discloses a composition formed by a siloxane polymer such as a phenolic hydroxy group or a carboxyl group formed by a cycloaddition reaction and a quinone diazide compound. However, issues such as coloring readily occur to the compositions when the coating film is whitened or thermally cured due to a large amount of the quinone diazide compound in the compositions or the existence of the phenolic hydroxy group in the siloxane polymer. It should also be mentioned that, the cured films formed by the known compositions above all have the issue of poor chemical resistance and are not suitable for application.

Therefore, how to alleviate the issue of poor chemical resistance of the protective film formed by a photosensitive composition so as to meet the requirements of the current industry is an issue those skilled in the art urgently need to solve.

SUMMARY OF THE INVENTION

Accordingly, the invention provides a photosensitive composition for a protective film. The photosensitive composition is capable of alleviating the above issue of poor chemical resistance of the protective film.

The invention provides a photosensitive composition including a polysiloxane (A), an o-naphthoquinonediazidesulfonate (B), and a solvent (C). The polysiloxane (A) is obtained by polycondensing a mixture, wherein the mixture includes a silane monomer (a-1) represented by formula (1), a silane monomer (a-2) represented by formula (2), and a silicon-containing compound (a-3).

Specifically, the silane monomer (a-1) represented by formula (1) is as shown below.

$$(R^1O)_3Si-R^2-Si(OR^3)_3 \qquad \text{formula (1)}$$

In formula (1), $R^1$ and $R^3$ each independently represent a $C_1$ to $C_4$ alkyl group; $R^2$ represents a $C_1$ to $C_6$ alkylene group, a phenylene group, or a group represented by formula (1-1).

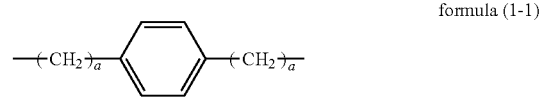

formula (1-1)

In formula (1-1), a each independently represents an integer of 1 to 4.

Moreover, the silane monomer (a-2) represented by formula (2) is as shown below.

$$Si(R^4)_b(OR^5)_{4-b} \qquad \text{formula (2)}$$

In formula (2), $R^4$ each independently represents a hydrogen atom, a $C_1$ to $C_{10}$ alkyl group, a $C_2$ to $C_{10}$ alkenyl group, a $C_6$ to $C_{15}$ aromatic group, an acid anhydride group-containing alkyl group, an epoxy group-containing alkyl group, or an epoxy group-containing alkoxy group; $R^5$ each independently represents a hydrogen atom, a $C_1$ to $C_6$ alkyl group, a $C_1$ to $C_6$ acyl group, or a $C_6$ to $C_{15}$ aromatic group; b represents an integer of 1 to 3, and $R^4$ contains at least one of the acid anhydride group-containing alkyl group, the epoxy group-containing alkyl group, or the epoxy group-containing alkoxy group.

The silicon-containing compound (a-3) is selected from the group consisting of a silane monomer represented by formula (3), a siloxane prepolymer, and a silica particle, wherein the silane monomer represented by formula (3) is as shown below.

$$Si(R^6)_c(OR^7)_{4-c} \qquad \text{formula (3)}$$

In formula (3), $R^6$ each independently represents a hydrogen atom, a $C_1$ to $C_{10}$ alkyl group, a $C_2$ to $C_{10}$ alkenyl group, or a $C_6$ to $C_{15}$ aromatic group; $R^7$ each independently represents a hydrogen atom, a $C_1$ to $C_6$ alkyl group, a $C_1$ to $C_6$ acyl group, or a $C_6$ to $C_{15}$ aromatic group; and c represents an integer of 0 to 3.

In an embodiment of the invention, based on a total amount of 100 mol % of the monomers in the mixture, the usage amount of the silane monomer (a-1) is 0.1 mol % to 10 mol %, the usage amount of the silane monomer (a-2) is 1 mol % to 30 mol %, and the usage amount of the silicon-containing compound (a-3) is 60 mol % to 98.9 mol %.

In an embodiment of the invention, based on a usage amount of 100 parts by weight of the polysiloxane (A), the usage amount of the o-naphthoquinonediazidesulfonate (B) is 5 parts by weight to 30 parts by weight, and the usage amount of the solvent (C) is 200 parts by weight to 1200 parts by weight.

The invention also provides a protective film including the above photosensitive composition.

The invention further provides an element having a protective film, including an element and the above protective film, wherein the protective film covers the element.

Based on the above, when the photosensitive composition of the invention is used to form a protective film, the issue of poor chemical resistance can be alleviated. Therefore, the photosensitive composition of the invention is suitable for a protective film.

To make the above features and advantages of the invention more comprehensible, several embodiments are described in detail as follows.

DESCRIPTION OF THE EMBODIMENTS

<Photosensitive Composition>

The invention provides a photosensitive composition including a polysiloxane (A), an o-naphthoquinonediazidesulfonate (B), and a solvent (C). Moreover, the photosensitive composition can further include an additive (D) if needed.

In the following, the individual components used in the photosensitive composition of the invention are described in detail.

It should be mentioned that, in the following, (meth)acrylic acid represents acrylic acid and/or methacrylic acid, and (meth)acrylate represents acrylate and/or methacrylate. Similarly, (meth)acryloyl group represents acryloyl group and/or methacryloyl group.

Polysiloxane (A)

The polysiloxane (A) is obtained by performing hydrolysis and partial condensation on a mixture, wherein the mixture includes a silane monomer (a-1), a silane monomer (a-2), and a silicon-containing compound (a-3). Each component of the mixture and the reaction steps and conditions of the polycondensation are further described below.

Silane Monomer (a-1)

The silane monomer (a-1) is a compound represented by formula (1).

$(R^1O)_3Si—R^2—Si(OR^3)_3$            formula (1)

In formula (1), $R^1$ and $R^3$ each independently represent a $C_1$ to $C_4$ alkyl group; $R^2$ represents a $C_1$ to $C_6$ alkylene group, a phenylene group, or a group represented by formula (1-1).

formula (1-1)

In formula (1-1), a each independently represents an integer of 1 to 4.

In formula (1), $R^1$ and $R^3$ each independently represent a $C_1$ to $C_4$ alkyl group. For instance, $R^1$ and $R^3$ can each independently represent a methyl group, an ethyl group, a propyl group, or a butyl group, preferably a methyl group or an ethyl group.

In formula (1), $R^2$ represents a $C_1$ to $C_6$ alkylene group, a phenylene group, or a group represented by formula (1-1). For instance, $R^2$ can represent a methylene group, an ethylene group, a propylene group, a trimethylene group, a tetramethylene group, a pentamethylene group, a hexamethylene group, or a phenylene group, and preferably represents a methylene group, an ethylene group, a phenylene group, or a group represented by formula (1-1). When $R^2$ represents a group represented by formula (1-1), a preferably represents an integer of 1 or 2.

Specific examples of the silane monomer (a-1) include bis(triethoxysilyl ethane), bis(trimethoxysilyl)methane, bis(triethoxysilyl)methane, bis-1,2-(trimethoxysilyl) ethane, bis-1,2-(triethoxy silyl) ethane, bis-1,6-(trimethoxysilyl) hexane, bis-1,6-(triethoxysilyl) hexane, bis-1,4-(trimethoxysilyl) benzene, bis-1,4-(triethoxysilyl) benzene, 1,4-bis(trimethoxysilylmethyl)benzene, 1,4-bis(trimethoxysilylethyl)benzene, 1,4-bis(triethoxysilylmethyl)benzene, 1,4-bis(triethoxysilylethyl)benzene, or a combination of the compounds.

Specific examples of the silane monomer (a-1) preferably include bis-1,2-(trimethoxysilyl) ethane (as shown in formula (1-2)), bis-1,6-(trimethoxysilyl) hexane (as shown in formula (1-3)), 1,4-bis(trimethoxysilylmethyl)benzene (as shown in formula (1-4)), or a combination of the compounds.

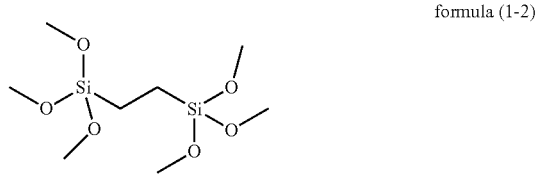

formula (1-2)

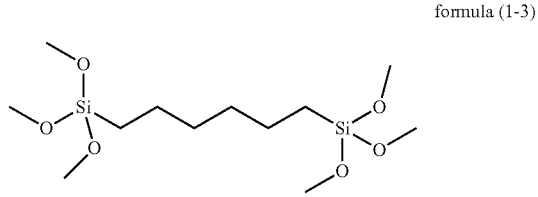

formula (1-3)

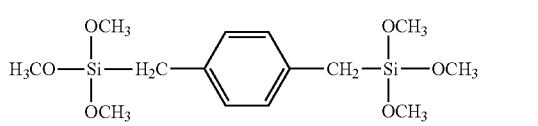

formula (1-4)

Based on a total amount of 100 mol % of the monomers in the mixture, the usage amount of the silane monomer (a-1) is 0.1 mol % to 10 mol %, preferably 0.5 mol % to 10 mol %, and more preferably 0.5 mol % to 8 mol %. When the mixture forming the polysiloxane (A) in the photosensitive composition does not contain the silane monomer (a-1), the chemical resistance of the protective film formed by the photosensitive composition is poor.

Silane Monomer (a-2)

The silane monomer (a-2) is a compound represented by formula (2).

$Si(R^4)_b(OR^5)_{4-b}$            formula (2)

In formula (2), $R^4$ each independently represents a hydrogen atom, a $C_1$ to $C_{10}$ alkyl group, a $C_2$ to $C_{10}$ alkenyl group, a $C_6$ to $C_{15}$ aromatic group, an acid anhydride group-containing alkyl group, an epoxy group-containing alkyl group, or an epoxy group-containing alkoxy group; $R^5$ each independently represents a hydrogen atom, a $C_1$ to $C_6$ alkyl group, a $C_1$ to $C_6$ acyl group, or a $C_6$ to $C_{15}$ aromatic group; b represents an integer of 1 to 3, and $R^4$ contains at least one of the acid anhydride group-containing alkyl group, the epoxy group-containing alkyl group, or the epoxy group-containing alkoxy group.

More specifically, when $R^4$ in formula (2) represents a $C_1$ to $C_{10}$ alkyl group, specifically, $R^4$ is, for instance, a methyl group, an ethyl group, an n-propyl group, an isopropyl group, an n-butyl group, a t-butyl group, an n-hexyl group, or an n-decyl group. Moreover, $R^4$ can also be an alkyl group having other substituents. Specifically, $R^4$ is, for instance, trifluoromethyl, 3,3,3-trifluoropropyl, 3-aminopropyl, 3-mercaptopropyl, or 3-isocyanatepropyl.

When $R^4$ in formula (2) represents a $C_2$ to $C_{10}$ alkenyl group, specifically, $R^4$ is, for instance, a vinyl group. Moreover, $R^4$ can also be an alkenyl group having other substituents. Specifically, $R^4$ is, for instance, 3-acryoyloxypropyl or 3-methylacryloyloxypropyl.

When $R^4$ in formula (2) represents a $C_6$ to $C_{15}$ aromatic group, specifically, $R^4$ is, for instance, a phenyl group, a tolyl group, or a naphthyl group. Moreover, $R^4$ can also be an aromatic group having other substituents. Specifically, $R^4$ is, for instance, p-hydroxyphenyl, 1-(p-hydroxyphenyl)ethyl, 2-(p-hydroxyphenyl)ethyl, or 4-hydroxy-5-(p-hydroxyphenylcarbonyloxy)pentyl.

Moreover, $R^4$ in formula (2) represents an acid anhydride group-containing alkyl group, wherein the alkyl group is preferably a $C_1$ to $C_{10}$ alkyl group. Specifically, the acid anhydride group-containing alkyl group is, for instance, a group shown in formula (2-1) to formula (2-3). It should be mentioned that, the acid anhydride group is a group formed by the intramolecular dehydration of a dicarboxylic acid, wherein the dicarboxylic acid is, for instance, succinic acid or glutaric acid.

formula (2-1)

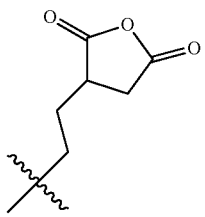

formula (2-2)

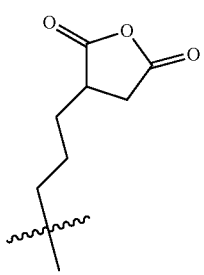

formula (2-3)

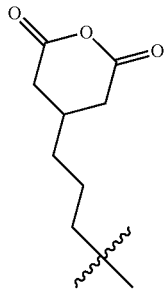

Moreover, $R^4$ in formula (2) represents an epoxy group-containing alkyl group, wherein the alkyl group is preferably a $C_1$ to $C_{10}$ alkyl group. Specifically, the epoxy group-containing alkyl group is, for instance, oxetanylpentyl or 2-(3,4-epoxycyclohexyl)ethyl. It should be mentioned that, the epoxy group is a group formed by the intramolecular dehydration of diol, wherein the diol is, for instance, propanediol, butanediol, or pentanediol.

$R^4$ in formula (2) represents an epoxy group-containing alkoxy group, wherein the alkoxy group is preferably a $C_1$ to $C_{10}$ alkoxy group. Specifically, the epoxy group-containing alkoxy group is, for instance, glycidoxypropyl or 2-oxetanylbutoxy.

Moreover, when $R^5$ in formula (2) represents a $C_1$ to $C_6$ alkyl group, specifically, $R^5$ is, for instance, a methyl group, an ethyl group, an n-propyl group, an isopropyl group, or an n-butyl group. When $R^5$ in formula (2) represents a $C_1$ to $C_6$ acyl group, specifically, $R^5$ is, for instance, an acetyl group. When $R^5$ in formula (2) represents a $C_6$ to $C_{15}$ aromatic group, specifically, $R^5$ is, for instance, a phenyl group.

In formula (2), b is an integer of 1 to 3. When b represents 2 or 3, a plurality of $R^4$ can be the same or different, and when b represents 1 or 2, a plurality of $R^5$ can be the same or different.

Specific examples of the silane monomer (a-2) include a silane monomer of an acid anhydride group-containing alkyl group, a silane monomer of an epoxy group-containing alkyl group, or an epoxy group-containing silane monomer.

Specific examples of the silane monomer of an acid anhydride group-containing alkyl group include 3-triphenoxysilyl propyl succinic anhydride, a commercial product made by Shin-Etsu Chemical: 3-trimethoxysilyl propyl succinic anhydride (product name: X-12-967), a commercial product made by WACKER Company: 3-(triethoxysilyl) propyl succinic anhydride (product name: GF-20), 3-(trimethoxysilyl) propyl glutaric anhydride (TMSG), 3-(triethoxysilyl) propyl glutaric anhydride, 3-(triphenoxysilyl) propyl glutaric anhydride, (di-n-butoxysilyl) di(propyl succinic anhydride), (dimethoxysilyl) di(ethyl succinic anhydride), phenoxysilyltripropyl succinic anhydride, methoxysilyldiethyl succinic anhydride, or a combination of the compounds.

Specific examples of the epoxy group-containing silane monomer and the silane monomer of an epoxy group-containing alkyl group include 3-glycidoxypropyltrimethoxysilane, 3-glycidoxypropyltriethoxysilane, 2-(3,4-epoxycyclohexyl)ethyltrimethoxysilane, 2-oxetanylbutoxypropyltriphenoxysilane, and a commercial product made by Toagosei: 2-oxetanylbutoxypropyltrimethoxysilane (product name: TMSOX-D), 2-oxetanylbutoxypropyltriethoxysilane (product name: TESOX-D), diisopropoxy-di(2-oxetanylbutoxypropyl)silane (DIDOS), di(3-oxetanylpentyl)dimethoxy silane, 3-glycidoxypropyldimethylmethoxysilane, 3-glycidoxypropyldimethylethoxysilane, di(2-oxetanylbutoxypentyl)-2-oxetanylpentylethoxysilane, tri(2-oxetanylpentyl)methoxy silane, or a combination of the compounds.

The silane monomer (a-2) can be used alone or in multiple combinations.

Specific examples of the silane monomer (a-2) preferably include 3-(triethoxysilyl)propyl succinic anhydride, 3-(trimethoxysilyl)propyl glutaric anhydride, (dimethoxysilyl) di(ethyl succinic anhydride), 2-oxetanylbutoxypropyltrimethoxysilane, 2-(3,4-epoxycyclohexyl)ethyltrimethoxysilane, 2-oxetanylbutoxypropyltriethoxysilane, or a combination of the compounds.

Based on a total amount of 100 mol % of the monomers in the mixture, the usage amount of the silane monomer (a-2) is 1 mol % to 30 mol %, preferably 5 mol % to 30 mol %, and more preferably 5 mol % to 25 mol %. When the mixture forming the polysiloxane (A) in the photosensitive composition does not contain the silane monomer (a-2), the chemical resistance of the protective film formed by the photosensitive composition is poor.

Silicon-containing Compound (a-3)

The silicon-containing compound (a-3) is selected from the group consisting of a silane monomer represented by formula (3), a siloxane prepolymer, and a silica particle.

The silane monomer represented by formula (3) is as shown below.

$$Si(R^6)_c(OR^7)_{4-c} \qquad \text{formula (3)}$$

In formula (3), $R^6$ each independently represents a hydrogen atom, a $C_1$ to $C_{10}$ alkyl group, a $C_2$ to $C_{10}$ alkenyl group, or a $C_6$ to $C_{15}$ aromatic group; $R^7$ each independently represents a hydrogen atom, a $C_1$ to $C_6$ alkyl group, a $C_1$ to $C_6$ acyl group, or a $C_6$ to $C_{15}$ aromatic group; and c represents an integer of 0 to 3.

More specifically, when $R^6$ in formula (3) represents a $C_1$ to $C_{10}$ alkyl group, specifically, $R^6$ is, for instance, a methyl group, an ethyl group, an n-propyl group, an isopropyl group, an n-butyl group, a t-butyl group, an n-hexyl group, or an n-decyl group. Moreover, $R^6$ can also be an alkyl group having other substituents. Specifically, $R^6$ is, for instance, trifluoromethyl, 3,3,3-trifluoropropyl, 3-aminopropyl, 3-mercaptopropyl, or 3-isocyanatepropyl.

When $R^6$ in formula (3) represents a $C_2$ to $C_{10}$ alkenyl group, specifically, $R^6$ is, for instance, a vinyl group. Moreover, $R^6$ can also be an alkenyl group having other substituents. Specifically, $R^6$ is, for instance, 3-acryoyloxypropyl or 3-methylacryloyloxypropyl.

When $R^6$ in formula (3) represents a $C_6$ to $C_{15}$ aromatic group, specifically, $R^6$ is, for instance, a phenyl group, a tolyl group, or a naphthyl group. Moreover, $R^6$ can also be an aromatic group having other substituents. Specifically, $R^6$ is, for instance, p-hydroxyphenyl, 1-(p-hydroxyphenyl)ethyl, 2-(p-hydroxyphenyl)ethyl, or 4-hydroxy-5-(p-hydroxyphenylcarbonyloxy)pentyl.

Moreover, when $R^7$ in formula (3) represents a $C_1$ to $C_6$ alkyl group, specifically, $R^7$ is, for instance, a methyl group, an ethyl group, an n-propyl group, an isopropyl group, or an n-butyl group. When $R^7$ in formula (3) represents a $C_1$ to $C_6$ acyl group, specifically, $R^7$ is, for instance, an acetyl group. When $R^7$ in formula (3) represents a $C_6$ to $C_{15}$ aromatic group, specifically, $R^7$ is, for instance, a phenyl group.

In formula (3), c is an integer of 0 to 3. When c represents 2 or 3, a plurality of $R^6$ can be the same or different, and when c represents 0, 1, or 2, a plurality of $R^7$ can be the same or different.

In formula (3), when c=0, the silane monomer is a tetrafunctional silane monomer (i.e., a silane monomer having four hydrolyzable groups); when c=1, the silane monomer is a trifunctional silane monomer (i.e., a silane monomer having three hydrolyzable groups); when c=2, the silane monomer is a bifunctional silane monomer (i.e., a silane monomer having two hydrolyzable groups); and when c=3, the silane monomer is a monofunctional silane monomer (i.e., a silane monomer having one hydrolyzable group). It should be mentioned that, the hydrolyzable group refers to a group capable of being reacted in a hydrolysis reaction and bonded to silicon. For instance, the hydrolyzable group is, for instance, an alkoxy group, an acyloxy group, or a phenoxy group.

Specific examples of the silane monomer represented by formula (3) include:

(1) a tetrafunctional silane monomer: tetramethoxysilane, tetraethoxysilane, tetraacetoxysilane, or tetraphenoxy silane;

(2) a trifunctional silane monomer: methyltrimethoxysilane (MTMS), methyltriethoxysilane, methyltriisopropoxysilane, methyltri-n-butoxysilane, ethyltrimethoxysilane, ethyltriethoxysilane, ethyltriisopropoxysilane, ethyltri-n-butoxysilane, n-propyltrimethoxysilane, n-prop yltriethoxysilane, n-butyltrimethoxysilane, n-butyltriethoxysilane, n-hexyltrimethoxysilane, n-hexyltriethoxysilane, decyltrimethoxysilane, vinyltrimethoxysilane, vinyltriethoxysilane, 3-acryoyloxypropyltrimethoxysilane, 3-methylacryloyloxypropyltrimethoxysilane (MPTMS), 3-methylacryloyloxypropyltriethoxysilane, phenyltrimethoxysilane (PTMS), phenyltriethoxysilane (PTES), p-hydroxyphenyltrimethoxysilane, 1-(p-hydroxyphenyl)ethyltrimethoxysilane, 2-(p-hydroxyphenyl)ethyltrimethoxysilane, 4-hydroxy-5-(p-hydroxyphenylcarbonyloxy)pentyltrimethoxysilane, trifluoromethyltrimethoxysilane, trifluoromethyltriethoxysilane, 3,3,3-trifluoropropyltrimethoxysilane, 3-aminopropyltrimethoxysilane, 3-aminopropyltriethoxysilane, or 3-mercaptopropyltrimethoxysilane;

(3) a bifunctional silane monomer: dimethyldimethoxysilane (DMDMS), dimethyldiethoxysilane, dimethyldiacetyloxysilane, di-n-butyldimethoxysilane, or diphenyldimethoxysilane; or (4) a monofunctional silane monomer: trimethylmethoxysilane or tri-n-butylethoxysilane . . . etc. The various silane monomers can be used alone or in multiple combinations.

The siloxane prepolymer is a compound represented by formula (4).

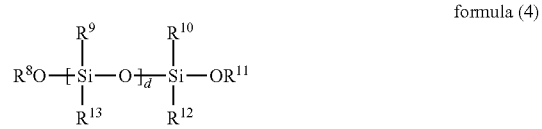

formula (4)

In formula (4), $R^9$, $R^{10}$, $R^{12}$, and $R^{13}$ each independently represent a hydrogen atom, a $C_1$ to $C_{10}$ alkyl group, a $C_2$ to $C_6$ alkenyl group, or a $C_6$ to $C_{15}$ aromatic group. $R^8$ and $R^{11}$ each independently represent a hydrogen atom, a $C_1$ to $C_6$ alkyl group, a $C_1$ to $C_6$ acyl group, or a $C_6$ to $C_{15}$ aromatic group. d represents an integer of 1 to 1000.

In formula (4), $R^9$, $R^{10}$, $R^{12}$, and $R^{13}$ each independently represent a $C_1$ to $C_{10}$ alkyl group. For instance, $R^9$, $R^{10}$, $R^{12}$, and $R^{13}$ are each independently a methyl group, an ethyl group, or an n-propyl group . . . etc. In formula (4), $R^9$, $R^{10}$, $R^{12}$, and $R^{13}$ each independently represent a $C_2$ to $C_{10}$ alkenyl group. For instance, $R^9$, $R^{10}$, $R^{12}$, and $R^{13}$ are each independently a vinyl group, an acryloyloxypropyl group, or a methacryloyloxypropyl group. In formula (4), $R^9$, $R^{10}$, $R^{12}$, and $R^{13}$ each independently represent a $C_6$ to $C_{15}$ aromatic group. For instance, $R^9$, $R^{10}$, $R^{12}$, and $R^{13}$ are each independently a phenyl group, a tolyl group, or a naphthyl group . . . etc. It should be mentioned that, any one of the alkyl group, alkenyl group, and aromatic group can optionally have a substituent.

In formula (4), $R^8$ and $R^{11}$ each independently represent a $C_1$ to $C_6$ alkyl group. For instance, $R^8$ and $R^{11}$ are each independently a methyl group, an ethyl group, an n-propyl group, an isopropyl group, or an n-butyl group. In formula (4), $R^8$ and $R^{11}$ each independently represent a $C_1$ to $C_6$ acyl group such as an acetyl group. In formula (4), $R^8$ and $R^{11}$ each independently represent a $C_6$ to $C_{15}$ aromatic group such as a phenyl group. It should be mentioned that, any one of the alkyl group, acyl group, and aromatic group can optionally have a substituent.

In formula (4), d can be an integer of 1 to 1000, preferably an integer of 3 to 300, and more preferably an integer of 5 to 200. When d is an integer of 2 to 1000, $R^9$ is each the same or a different group, and $R^{13}$ is each the same or a different group.

The siloxane prepolymer shown in formula (4) is, for instance, 1,1,3,3-tetramethyl-1,3-dimethoxydisiloxane, 1,1,3,3-tetramethyl-1,3-diethoxydisiloxane, 1,1,3,3-tetraethyl-1,3-diethoxydisiloxane, or a commercial product (such as DMS-S 12 (molecular weight: 400 to 700), DMS-S15 (molecular weight: 1500 to 2000), DMS-S21 (molecular weight: 4200), DMS-S27 (molecular weight: 18000), DMS-S31 (molecular weight: 26000), DMS-S32 (molecular weight: 36000), DMS-S33 (molecular weight: 43500), DMS-S35 (molecular weight: 49000), DMS-S38 (molecular weight: 58000), DMS-S42 (molecular weight: 77000), or PDS-9931 (molecular weight: 1000 to 1400)) of silanol-terminated polydimethylsiloxane made by Gelest Inc. The siloxane prepolymer shown in formula (4) can be used alone or in multiple combinations.

The average particle size of the silica particle is not particularly limited. The average particle size ranges from 2 nm to 250 nm, preferably 5 nm to 200 nm, and more preferably 10 nm to 100 nm.

Specific examples of the silica particle include a commercial product made by JGC Catalysts & Chemicals Co., Ltd. (such as OSCAR 1132 (particle size: 12 nm; dispersant: methanol), OSCAR 1332 (particle size: 12 nm; dispersant: n-propanol), OSCAR 105 (particle size: 60 nm; dispersant: γ-butyrolactone), or OSCAR 106 (particle size: 120 nm; dispersant: diacetone alcohol) . . . etc.); a commercial product made by Fuso Chemical Co. (such as Quartron PL-1-IPA (particle size: 13 nm; dispersant: isopropyl alcohol), Quartron PL-1-TOL (particle size: 13 nm; dispersant: toluene), Quartron PL-2L-PGME (particle size: 18 nm; dispersant: propylene glycol monomethyl ether), or Quartron PL-2L-MEK (particle size: 18 nm; dispersant: methyl ethyl ketone)); or a commercial product made by Nissan Chemical Company (such as IPA-ST (particle size: 12 nm; dispersant: isopropyl alcohol), EG-ST (particle size: 12 nm; dispersant: ethylene glycol), IPA-ST-L (particle size: 45 nm; dispersant: isopropyl alcohol), or IPA-ST-ZL (particle size: 100 nm; dispersant: isopropyl alcohol)). The silica particle can be used alone or in multiple combinations.

Based on a total amount of 100 mol % of the monomers in the mixture, the usage amount of the silicon-containing compound (a-3) is 60 mol % to 98.9 mol %, preferably 60 mol % to 94.5 mol %, and more preferably 67 mol % to 94.5 mol %.

Reaction Steps and Conditions of Polycondensation

In general, the polymerization reaction (i.e., hydrolysis and partial condensation) of the silane monomer (a-1), the silane monomer (a-2), and the silicon-containing compound (a-3) is performed with the following steps: a mixture of the silane monomer (a-1), the silane monomer (a-2), and the silicon-containing compound (a-3) is added to a solvent and water, and a catalyst can optionally be added. Next, the mixture is heated at 50° C. to 150° C. and stirred for 0.5 hours to 120 hours, and byproducts (such as alcohol and water) can further be removed via distillation.

The solvent used in the polymerization reaction is not particularly limited, and the solvent can be the same or different from the solvent (C) included in the photosensitive composition of the invention. Based on a total amount of 100 g of the silane monomer (a-1), the silane monomer (a-2), and the silicon-containing compound (a-3), the usage amount of the solvent is preferably 15 g to 1200 g; preferably 20 g to 1100 g; and more preferably 30 g to 1000 g.

Based on 1 mole of the hydrolyzable group of the silane monomer (a-1), the silane monomer (a-2), and the silicon-containing compound (a-3), the water (i.e., water used for hydrolysis) used in the polymerization reaction is 0.5 moles to 2 moles.

The catalyst used in the polymerization reaction is not particularly limited, and is preferably selected from an acidic catalyst or a basic catalyst. Specific examples of the acidic catalyst include, for instance, hydrochloric acid, nitric acid, sulfuric acid, hydrofluoric acid, oxalic acid, phosphoric acid, acetic acid, trifluoroacetic acid, formic acid, polybasic carboxylic acid, or an acid anhydride thereof; or an ion-exchange resin. Specific examples of the basic catalyst include, for instance, diethylamine, triethylamine, tripropylamine, tributylamine, tripentylamine, trihexylamine, triheptylamine, trioctylamine, diethanolamine, triethanolamine, sodium hydroxide, potassium hydroxide, a silane containing an amino group and having an alkoxy group, or an ion-exchange resin.

Based on a total amount of 100 g of the silane monomer (a-1), the silane monomer (a-2), and the silicon-containing compound (a-3), the usage amount of the catalyst used in the polymerization reaction is preferably 0.005 g to 15 g, more preferably 0.01 g to 12 g, and preferably 0.05 g to 10 g.

From the view point of stability, the polysiloxane (A) preferably does not contain a byproduct (such as alcohol or water) and a catalyst. Therefore, the reaction mixture after the polymerization reaction can optionally be purified to obtain the polysiloxane (A). The method of purification is not particularly limited, and is preferably capable of diluting the reaction mixture with a hydrophobic solvent. Then, the hydrophobic solvent and the reaction mixture are transferred to a separation funnel. Next, the organic layer is washed with water several times, and the organic layer is concentrated with a rotary evaporator to remove the alcohol or water. Moreover, an ion exchange resin can be used to remove the catalyst.

o-naphthoquinonediazidesulfonate (B)

The type of the o-naphthoquinonediazidesulfonate (B) is not particularly limited, and a general o-naphthoquinonediazidesulfonate can be used. The o-naphthoquinonediazidesulfonate (B) can be a completely esterified or partially esterified ester-based compound.

The o-naphthoquinonediazidesulfonate (B) is preferably prepared by reacting an o-naphthoquinonediazidesulfonic acid or a salt thereof and a hydroxy compound. The o-naphthoquinonediazidesulfonate (B) is more preferably prepared by reacting an o-naphthoquinonediazidesulfonic acid or a salt thereof and a polyhydroxy compound.

Specific examples of the o-naphthoquinonediazidesulfonic acid include, for instance, o-naphthoquinonediazide-4-sulfonic acid, o-naphthoquinonediazide-5-sulfonic acid, or o-naphthoquinonediazide-6-sulfonic acid. Moreover, the salt of the o-naphthoquinonediazidesulfonic acid is, for instance, diazonaphthoquinone sulfonyl halide.

Specific examples of the hydroxy compound include a hydroxybenzophenone-based compound, a hydroxyaryl-based compound, a (hydroxyphenyl)hydrocarbon compound, other aromatic hydroxy compounds, or a combination of the compounds.

(1) Specific examples of the hydroxybenzophenone-based compound include, for instance, 2,3,4-trihydroxybenzophenone, 2,4,4'-trihydroxybenzophenone, 2,4,6-trihydroxybenzophenone, 2,3,4,4'-tetrahydroxybenzophenone, 2,4,2',4'-tetrahydroxybenzophenone, 2,4,6,3',4'-pentahydroxybenzophenone, 2,3,4,2',4'-pentahydroxybenzophenone, 2,3,4,2',5'-pentahydroxybenzophenone, 2,4,5,3',5'-pentahydroxybenzophenone, or 2,3,4,3',4',5'-hexahydroxybenzophenone.

(2) Specific examples of the hydroxyaryl-based compound include a hydroxyaryl-based compound represented by formula (5).

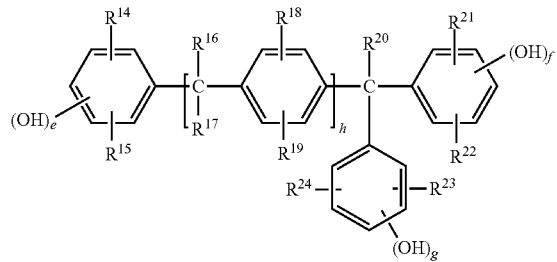

formula (5)

In formula (5), $R^{14}$ and $R^{15}$ each independently represent a hydrogen atom, a halogen atom, or a $C_1$ to $C_6$ alkyl group; $R^{16}$, $R^{17}$, and $R^{20}$ each independently represent a hydrogen atom or a $C_1$ to $C_6$ alkyl group; $R^{18}$, $R^{19}$, $R^{21}$, $R^{22}$, $R^{23}$, and $R^{24}$ each independently represent a hydrogen atom, a halogen atom, a $C_1$ to $C_6$ alkyl group, a $C_1$ to $C_6$ alkoxy group, a $C_1$ to $C_6$ alkenyl group, or a cycloalkyl group; e, f, and g each independently represent an integer of 1 to 3; and h represents 0 or 1.

Specifically, specific examples of the hydroxyaryl-based compound represented by formula (5) include tris(4-hydroxyphenyl)methane, bis(4-hydroxy-3,5-dimethylphenyl)-4-hydroxyphenylmethane, bis(4-hydroxy-3,5-dimethylphenyl)-3-hydroxyphenylmethane, bis(4-hydroxy-3,5-dimethylphenyl)-2-hydroxyphenylmethane, bis(4-hydroxy-2,5-dimethylphenyl)-4-hydroxyphenylmethane, bis(4-hydroxy-2,5-dimethylphenyl)-3-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-3,5-dimethylphenyl)-2,4-dihydroxyphenylmethane, bis(4-hydroxy-2,5-dimethylphenyl)-2,4-dihydroxyphenylmethane, bis(4-hydroxyphenyl)-3-methoxy-4-hydroxyphenylmethane, bis(3-cyclohexyl-4-hydroxyphenyl)-3-hydroxyphenylmethane, bis(3-cyclohexyl-4-hydroxyphenyl)-2-hydroxyphenylmethane, bis(3-cyclohexyl-4-hydroxyphenyl)-4-hydroxyphenylmethane, bis(3-cyclohexyl-4-hydroxy-6-methylphenyl)-2-hydroxyphenylmethane, bis(3-cyclohexyl-4-hydroxy-6-methylphenyl)-3-hydroxyphenylmethane, bis(3-cyclohexyl-4-hydroxy-6-methylphenyl)-4-hydroxyphenylmethane, bis(3-cyclohexyl-4-hydroxy-6-methylphenyl)-3,4-dihydroxyphenylmethane, bis(3-cyclohexyl-6-hydroxyphenyl)-3-hydroxyphenylmethane, bis(3-cyclohexyl-6-hydroxyphenyl)-4-hydroxyphenylmethane, bis(3-cyclohexyl-6-hydroxyphenyl)-2-hydroxyphenylmethane, bis(3-cyclohexyl-6-hydroxy-4-methylphenyl)-2-hydroxyphenylmethane, bis(3-cyclohexyl-6-hydroxy-4-methylphenyl)-4-hydroxyphenylmethane, bis(3-cyclohexyl-6-hydroxy-4-methylphenyl)-3,4-dihydroxyphenylmethane, 1-[1-(4-hydroxyphenyl)isopropyl]-4-[1,1-bis(4-hydroxyphenyl)ethyl]benzene, 1-[1-(3-methyl-4-hydroxyphenyl)isopropyl]-4-[1,1-bis(3-methyl-4-hydroxyphenyl)ethyl]benzene, or a combination of the compounds.

(3) Specific examples of the (hydroxyphenyl)hydrocarbon compound include a (hydroxyphenyl)hydrocarbon compound represented by formula (6).

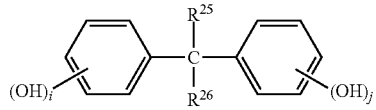

formula (6)

In formula (6), $R^{25}$ and $R^{26}$ each independently represent a hydrogen atom or a $C_1$ to $C_6$ alkyl group; and i and j each independently represent an integer of 1 to 3.

Specifically, specific examples of the (hydroxyphenyl)hydrocarbon compound represented by formula (6) include, for instance, 2-(2,3,4-trihydroxyphenyl)-2-(2',3',4'-trihydroxyphenyl)propane, 2-(2,4-dihydroxyphenyl)-2-(2',4'-dihydroxyphenyl)propane, 2-(4-hydroxyphenyl)-2-(4'-hydroxyphenyl)propane, bis(2,3,4-trihydroxyphenyl)methane, or bis(2,4-dihydroxyphenyl)methane.

(4) Specific examples of the other aromatic hydroxy compounds include, for instance, phenol, p-methoxyphenol, dimethylphenol, hydroquinone, bisphenol A, naphthol, catechol, 1,2,3-pyrogallol monomethyl ether, 1,2,3-pyrogallol-1,3-dimethyl ether, 3,4,5-trihydroxybenzoic acid, or partially esterified or partially etherified 3,4,5-trihydroxybenzoic acid.

The hydroxy compound is preferably 1-[1-(4-hydroxyphenyl)isopropyl]-4-[1,1-bis(4-hydroxyphenyl)ethyl]benzene, 2,3,4-trihydroxybenzophenone, 2,3,4,4'-tetrahydroxybenzophenone, or a combination thereof. The hydroxy compound can be used alone or in multiple combinations.

The reaction of the o-naphthoquinonediazidesulfonic acid or a salt thereof and the hydroxy compound is generally performed in an organic solvent such as dioxane, N-pyrrolidone, or acetamide. Moreover, the above reaction is preferably performed in the presence of a basic condensing agent such as triethanolamine, alkali metal carbonate, or alkali metal bicarbonate.

The degree of esterification of the o-naphthoquinonediazidesulfonate (B) is preferably at least 50%. That is, based on a total amount of 100 mol % of the hydroxy group in the hydroxy compound, at least 50 mol % of the hydroxy group in the hydroxy compound is reacted in an esterification reaction with the o-naphthoquinonediazidesulfonic acid or a salt thereof. The degree of esterification of the o-naphthoquinonediazidesulfonate (B) is more preferably at least 60%.

Based on a usage amount of 100 parts by weight of the polysiloxane (A), the usage amount of the o-naphthoquinonediazidesulfonate (B) is 5 parts by weight to 30 parts by weight, preferably 5 parts by weight to 28 parts by weight, and more preferably 5 parts by weight to 25 parts by weight.

Solvent (C)

The type of the solvent (C) is not particularly limited. The solvent (C) is, for instance, an alcoholic hydroxy group-containing compound or a carbonyl group-containing cyclic compound . . . etc.

Specific examples of the alcoholic hydroxy group-containing compound include acetol, 3-hydroxy-3-methyl-2-butanone, 4-hydroxy-3-methyl-2-butanone, 5-hydroxy-2-pentanone, 4-hydroxy-4-methyl-2-pentanone (also referred to as diacetone alcohol (DAA)), ethyl lactate, butyl lactate, propylene glycol monomethyl ether, propylene glycol monoethyl ether (PGEE), propylene glycol monomethyl ether acetate (PGMEA), propylene glycol mono-n-propyl ether, propylene glycol mono-n-butyl ether, propylene glycol mono-t-butyl ether, 3-methoxy-1-butanol, 3-methyl-3-methoxy-1-butanol, or a combination thereof. It should be mentioned that, the alcoholic hydroxy group-containing compound is preferably DAA, ethyl lactate, PGEE, PGMEA, or a combination thereof. The alcoholic hydroxy group-containing compound can be used alone or in multiple combinations.

Specific examples of the carbonyl group-containing cyclic compound include, for instance, γ-butyrolactone, γ-valerolactone, δ-valerolactone, propylene carbonate, N-methyl pyrrolidone, cyclohexanone, or cycloheptanone. It should be mentioned that, the carbonyl group-containing cyclic compound is preferably γ-butyrolactone, N-methyl pyrrolidone, cyclohexanone, or a combination thereof. The carbonyl group-containing cyclic compound can be used alone or in multiple combinations.

The alcoholic hydroxy group-containing compound can be used in combination with the carbonyl group-containing cyclic compound, and the weight ratio thereof is not particularly limited. The weight ratio of the alcoholic hydroxy group-containing compound and the carbonyl group-containing cyclic compound is preferably 99/1 to 50/50, more preferably 95/5 to 60/40. It should be mentioned that, in the solvent (C), when the weight ratio of the alcoholic hydroxy group-containing compound and the carbonyl group-containing cyclic compound is 99/1 to 50/50, the unreacted silanol group (Si—OH) in the polysiloxane (A) is not readily reacted in a condensation reaction and storage stability is therefore reduced. Moreover, since the compatibility of the alcoholic hydroxy group-containing compound and the carbonyl group-containing cyclic compound with the o-naphthoquinonediazidesulfonate (B) is good, the whitening phenomenon does not readily occur when the alcoholic hydroxy group-containing compound and the carbonyl group-containing cyclic compound are coated into a film. As a result, the transparency of the protective film can be maintained.

Without impairing the effect of the invention, the solvent (C) can also contain other solvents. The other solvents are, for instance: (1) an ester: ethyl acetate, n-propyl acetate, i-propyl acetate, n-butyl acetate, i-butyl acetate, propylene glycol monomethyl ether acetate, 3-methoxy-1-butyl acetate, or 3-methyl-3-methoxy-1-butyl acetate . . . etc.; (2) a ketone: methyl iso-butyl ketone, diisopropyl ketone, or diisobutyl ketone . . . etc.; or (3) an ether: diethyl ether, diisopropyl ether, di-n-butyl ether, or diphenyl ether . . . etc.

Based on a usage amount of 100 parts by weight of the polysiloxane (A), the usage amount of the solvent (C) is 200 part by weight to 1200 parts by weight; preferably 250 parts by weight to 1100 parts by weight; and more preferably 300 parts by weight to 1000 parts by weight.

Additive (D)

An additive (D) can optionally be further added to the photosensitive composition of the invention. Specifically, the solvent (D) is, for instance, a sensitizer, an adhesion auxiliary agent, a surfactant, a solubility promoter, a defoamer, or a combination thereof.

The type of the sensitizer is not particularly limited. The sensitizer is preferably a phenolic hydroxy group-containing compound, wherein specific examples of the phenolic hydroxy group-containing compound include a trisphenol-type compound, a bisphenol-type compound, a polynuclear-branched compound, a condensation-type phenol compound, polyhydroxy benzophenone, or a combination of the compounds.

(1) Specific examples of the trisphenol-type compound include tris(4-hydroxyphenyl)methane, bis(4-hydroxy-3-methylphenyl)-2-hydroxyphenylmethane, bis(4-hydroxy-2,3,5-trimethylphenyl)-2-hydroxyphenylmethane, bis(4-hydroxy-3,5-dimethylphenyl)-4-hydroxyphenylmethane, bis (4-hydroxy-3,5-dimethylphenyl)-3-hydroxyphenylmethane, bis(4-hydroxy-3,5-methylphenyl)-2-hydroxyphenylmethane, bis(4-hydroxy-2,5-dimethylphenyl)-4-hydroxyphenylmethane, bis(4-hydroxy-2,5-dimethylphenyl)-3-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-2,5-dimethylphenyl)-2,4-dihydroxyphenylmethane, bis(4-hydroxyphenyl)-3-methoxy-4-hydroxyphenylmethane, bis (5-cyclohexyl-4-hydroxy-2-methylphenyl)-4-hydroxyphenylmethane, bis(5-cyclohexyl-4-hydroxy-2-methylphenyl)-3-hydroxyphenylmethane, bis(5-cyclohexyl-4-hydroxy-2-methylphenyl)-2-hydroxyphenylmethane, or bis(5-cyclohexyl-4-hydroxy-2-methylphenyl)-3,4-dihydroxyphenylmethane.

(2) Specific examples of the bisphenol-type compound include, for instance, bis(2,3,4-trihydroxyphenyl)methane, bis(2,4-dihydroxyphenyl)methane, 2,3,4-trihydroxyphenyl-4'-hydroxyphenylmethane, 2-(2,3,4-trihydroxyphenyl)-2-(2',3',4'-trihydroxyphenyl)propane, 2-(2,4-dihydroxyphenyl)-2-(2',4'-dihydroxyphenyl)propane, 2-(4-hydroxyphenyl)-2-(4'-hydroxyphenyl)propane, 2-(3-fluoro-4-hydroxyphenyl)-2-(3'-fluoro-4'-hydroxyphenyl)propane, 2-(2,4-dihydroxyphenyl)-2-(4'-hydroxyphenyl)propane, 2-(2,3,4-trihydroxyphenyl)-2-(4'-hydroxyphenyl)propane, or 2-(2,3,4-trihydroxyphenyl)-2-(4'-hydroxy-3',5'-dimethylphenyl)propane.

(3) Specific examples of the polynuclear-branched compound include, for instance, 1-[1-(4-hydroxyphenyl)isopropyl]-4-[1,1-bis(4-hydroxyphenyl)ethyl]benzene or 1-[1-(3-methyl-4-hydroxyphenyl)isopropyl]-4-[1,1-bis(3-methyl-4-hydroxyphenyl)ethyl]benzene.

(4) Specific examples of the condensation-type phenol compound include, for instance, 1,1-bis(4-hydroxyphenyl) cyclohexane.

(5) Specific examples of the polyhydroxy benzophenone include, for instance, 2,3,4-trihydroxybenzophenone, 2,4,4'-trihydroxybenzophenone, 2,4,6-trihydroxybenzophenone, 2,3,4-trihydroxy-2'-methylbenzophenone, 2,3,4,4'-tetrahydroxybenzophenone, 2,4,2',4'-tetrahydroxybenzophenone, 2,4,6,3',4'-pentahydroxybenzophenone, 2,3,4,2',4'-pentahydroxybenzophenone, 2,3,4,2',5'-pentahydroxybenzophenone, 2,4,6,3 ',4',5'-hexahydroxybenzophenone, or 2,3,4,3',4',5'-hexahydroxybenzophenone.

Based on a usage amount of 100 parts by weight of the polysiloxane (A), the usage amount of the sensitizer is 5 parts by weight to 50 parts by weight, preferably 8 parts by weight to 40 parts by weight, and more preferably 10 parts by weight to 35 parts by weight.

The adhesion auxiliary agent is, for instance, a melamine compound and a silane compound . . . etc. The function of the adhesion auxiliary agent is to increase the adhesion between the protective film formed by the photosensitive composition and the protected element.

A commercial product of melamine is, for instance, Cymel-300 or Cymel-303 . . . etc. made by Mitsui Chemicals or MW-30MH, MW-30, MS-11, MS-001, MX-750, or MX-706 . . . etc. made by Sanwa Chemical.

When a melamine compound is used as the adhesion auxiliary agent, based on a usage amount of 100 parts by weight of the polysiloxane (A), the usage amount of the melamine compound is 0 parts by weight to 20 parts by weight, preferably 0.5 parts by weight to 18 parts by weight, and more preferably 1.0 part by weight to 15 parts by weight.

The silane compound is, for instance, vinyltrimethoxysilane, vinyltriethoxysilane, 3-acryoyloxypropyltrimethoxysilane, vinyltris(2-methoxyethoxy)silane, N-(2-aminoethyl)-3-aminopropylmethyldimethoxysilane, N-(2-aminoethyl)-3-aminopropyltrimethoxysilane, 3-aminopropyltriethoxysilane, 3-glycidoxypropyltrimethoxysilane, 3-glycidoxypropyldimethylmethoxysilane, 2-(3,4-epoxycyclohexyl)ethyltrimethoxysilane, 3-chloropropylmethyldimethoxysilane, 3-chloropropyltrimethoxysilane, 3-methacryloxypropyltrimethoxysilane, 3-mercaptopropyltrimethoxysilane, or a commercial product (such as KBM403) made by Shin-Etsu Chemical Co . . . etc.

When a silane compound is used as the adhesion auxiliary agent, based on a usage amount of 100 parts by weight of the polysiloxane (A), the usage amount of the silane compound is 0 parts by weight to 2 parts by weight, preferably 0.05 parts by weight to 1 part by weight, and more preferably 0.1 parts by weight to 0.8 parts by weight.

The surfactant is, for instance, an anionic surfactant, a cationic surfactant, a nonionic surfactant, an amphoteric surfactant, a polysiloxane surfactant, a fluorine surfactant, or a combination thereof.

Specific examples of the surfactant include, for instance, (1) a polyoxyethylene alkyl ether such as polyoxyethylene lauryl ether; (2) a polyoxyethylene alkyl phenyl ether such as polyoxyethylene octylphenyl ether or polyoxyethylene nonylphenyl ether; (3) a polyethylene glycol diester such as polyethylene glycol dilaurate or polyethylene glycol distearate; (4) a sorbitan fatty acid ester; (5) a fatty acid-modified poly ester; and (6) a tertiary amine-modified polyurethane. A commercial product of the surfactant is, for instance, KP (made by Shin-Etsu Chemical), SF-8427 (made by Dow Corning Toray Silicone Co., Ltd.), Polyflow (made by Kyoeisha Oil Chemical Co., Ltd.), F-Top (made by Tochem Products Co., Ltd.), Megaface (made by DIC), Fluorade (made by Sumitomo 3M Ltd.), Surflon (made by Asahi Glass), SINOPOL E8008 (made by Sino-Japan Chemical Co., Ltd.), F-475 (made by DIC), or a combination thereof.

Based on a usage amount of 100 parts by weight of the polysiloxane (A), the usage amount of the surfactant is 0.5 parts by weight to 50 parts by weight, preferably 1 part by weight to 40 parts by weight, and more preferably 3 parts by weight to 30 parts by weight.

Specific examples of the defoamer include, for instance, Surfynol MD-20, Surfynol MD-30, EnviroGem AD01, EnviroGem AE01, EnviroGem AE02, Surfynol DF110D, Surfynol 104E, Surfynol 420, Surfynol DF37, Surfynol DF58, Surfynol DF66, Surfynol DF70, and Surfynol DF210 (made by Air products). Based on a total amount of 100 parts by weight of the polysiloxane (A), the usage amount of the defoamer is 1 part by weight to 10 parts by weight; preferably 2 parts by weight to 9 parts by weight; and more preferably 3 parts by weight to 8 parts by weight.

Specific examples of the solubility promoter include N-hydroxydicarboxylic imide and a phenolic hydroxy group-containing compound. The solubility promoter is, for instance, the phenolic hydroxy group-containing compound used in the o-naphthoquinonediazidesulfonate (B). Based on a usage amount of 100 parts by weight of the polysiloxane (A), the usage amount of the solubility promoter is 1 part by weight to 20 parts by weight, preferably 2 parts by weight to 15 parts by weight, and more preferably 3 parts by weight to 10 parts by weight.

<Preparation Method of Photosensitive Composition>

A method that can be used to prepare the photosensitive composition includes, for instance: placing and stirring the polysiloxane (A), the o-naphthoquinonediazidesulfonate (B), and the solvent (C) in a stirrer such that the components are uniformly mixed into a solution state, and the additive (D) can also be added when needed. After the mixture is uniformly mixed, the photosensitive composition in solution state can be obtained.

<Forming Method of Protective Film and Element having the Protective Film>

The invention provides a photosensitive composition capable of forming a protective film having good chemical resistance.

The invention provides an element having a protective film, including an element and the above protective film, wherein the protective film covers the element. Specifically, the element having the protective film is, for instance, a display element, a semiconductor element, or a core material or covering material of an optical waveguide . . . etc. Moreover, the photosensitive composition can also be used, for instance, in a planarized film or an interlayer insulation film for forming a thin-film transistor (TFT) substrate.

The forming method of the protective film is described in detail below. The method includes, in order: forming a pre-baked coating film using the photosensitive composition, performing patterning exposure on the pre-baked coating film, removing the unexposed region via alkali development to form a pattern, and performing a post-bake treatment to form the protective film.

Forming of Pre-baked Coating Film

The photosensitive composition in solution state is coated on a protected element (substrate hereinafter) by a coating method such as spin coating, cast coating, or roll coating to form a coating film.

The substrate can be a glass used in a liquid crystal display apparatus such as an alkali-free glass, soda-lime glass, hard glass (Pyrex glass), silica glass, such glasses with a transparent conductive film attached thereto, or a substrate (such as a silicon substrate) used in a photoelectric conversion apparatus (such as a solid imaging apparatus).

After the coating film is formed, most of the organic solvent of the photosensitive composition is removed by a method of reduced pressure drying. Next, the remaining organic solvent is completely removed by a pre-bake method, such that a pre-baked coating film is formed.

The operating conditions of the reduced pressure drying and pre-bake can be different based on the type and the mix ratio of each component. In general, drying under reduced pressure is performed at a pressure of 0 Torrs to 200 Torrs for 1 second to 60 seconds, and pre-bake is performed at a temperature of 70° C. to 110° C. for 1 minute to 15 minutes.

Patterning Exposure

The above pre-baked coating film is exposed with a photomask having a specific pattern. The light used in the exposure process is preferably an ultraviolet light such as a g-ray, an h-ray, or an i-ray. In addition, the equipment used to provide the ultraviolet light can be a/an (ultra-)high pressure mercury lamp or a metal halide lamp.

Development

The exposed pre-baked coating film is immersed in a developing solution at a temperature in the range of 23±2° C. and developed for about 15 seconds to 5 minutes to remove the unwanted portion of the exposed pre-baked coating film. As a result, a semifinished product of a protective film having a specific pattern can be formed on the substrate. Specific examples of the developing solution include an alkali compound such as sodium hydroxide, potassium hydroxide, sodium carbonate, sodium hydrogen carbonate, potassium carbonate, potassium hydrogen carbonate, sodium silicate, sodium methyl silicate, ammonia solution, ethylamine, diethylamine, dimethylethylanolamine, tetramethylammonium hydroxide (TMAH), tetraethylammonium hydroxide, choline, pyrrole, piperidine, or 1,8-diazabicyclo-(5.4.0)-7-undecene.

It should be mentioned that, if the concentration of the developing solution is too high, then the specific pattern is damaged or the resolution of the specific pattern is poor; and if the concentration is too low, then the development is poor, thus causing the specific pattern to not be formed or a portion of the composition residue to be exposed. Therefore, the concentration affects the subsequent forming of the exposed specific pattern of the photosensitive composition. The range of concentration of the developing solution is preferably 0.001 wt % to 10 wt %, more preferably 0.005 wt % to 5 wt %, and even more preferably 0.01 wt % to 1 wt %. A developing solution of 2.38 wt % of TMAH is used in the embodiments of the invention. It should be mentioned that, even if a developing solution having lower concentration is used, the photosensitive composition of the invention can also form a good finer pattern.

Post-bake Treatment

The substrate is washed with water (wherein the substrate has the semifinished product of the protective film having a predetermined pattern thereon) to remove the unwanted portion of the exposed pre-baked coating film. Then, the semifinished product of the protective film having a predetermined pattern is dried with compressed air or compressed nitrogen. Lastly, a post-bake treatment is performed on the semifinished product of the protective film having a predetermined pattern with a heating apparatus such as a hot plate or an oven. The heating temperature is set between 100° C. and 250° C., wherein when a hot plate is used, the heating time is 1 minute to 60 minutes, and when an oven is used, the heating time 5 minutes to 90 minutes. Accordingly, the pattern of the semifinished product of the protective film having a predetermined pattern can be fixed to form the protective film.

The following embodiments are used to further describe the invention. However, it should be understood that, the embodiments are only exemplary, and are not intended to limit the implementation of the invention.

Synthesis Embodiments and Comparative Synthesis Embodiments of Polysiloxane (A)

Synthesis embodiment A-1-1 to synthesis embodiment A-1-8 and comparative synthesis embodiment A-2-1 to comparative synthesis embodiment A-2-3 of the polysiloxane (A) are described below:

Synthesis Embodiment A-1-1

In a three-neck flask having a volume of 500 ml, 0.1 moles of bis-1,6-(trimethoxysilyl) hexane (hereinafter (a-1-1)), 10 moles of 3-(triethoxysilyl)propyl succinic anhydride (hereinafter (a-2-1)), 40 moles of methyltrimethoxysilane (hereinafter (a-3-1)), 45 moles of phenyltrimethoxysilane (hereinafter (a-3-3)), 4.9 moles of silanol-terminated polysiloxane (product name: DMS-S27, made by Gelest Inc., hereinafter (a-3-5)), and 200 g of propylene glycol monoethyl ether (hereinafter PGEE) were added, and an aqueous solution of oxalic acid (0.40 g of oxalic acid dissolved in 75 g of water) was added within 30 minutes while the mixture was stirred at room temperature. Then, the flask was immersed in an oil bath at 30° C. and stirred for 30 minutes. Next, the temperature of the oil bath was raised to 120° C. within 30 minutes. When the temperature of the solution was reduced to 105° C. (i.e., reaction temperature), the solution was continuously heated and stirred to perform polymerization for 6 hours (i.e., polycondensation time). Then, the solvent and the by-products were removed by a distillation method to obtain polysiloxane A-1-1. The type and the usage amount of each component of polysiloxane A-1-1 are as shown in Table 1.

Synthesis Embodiment A-1-2 to Synthesis Embodiment A-1-8

The polysiloxane (A) (i.e., polysiloxane A-1-2 to polysiloxane A-1-8) of each of synthesis embodiment A-1-2 to synthesis embodiment A-1-8 was prepared by the same steps as synthesis embodiment A-1-1, and the difference thereof is: the type and the usage amount of the reaction mixture, the reaction temperature, and the polycondensation time of the polysiloxane (A) were changed (as shown in Table 1).

Comparative Synthesis Embodiment A-2-1 to Comparative Synthesis Embodiment A-2-3

The polysiloxane (A) (i.e., polysiloxane A-2-1 to polysiloxane A-2-3) of each of comparative synthesis embodiment A-2-1 to comparative synthesis embodiment A-2-3 was prepared by the same steps as synthesis embodiment A-1-1, and the difference thereof is: the type and the usage amount of the reaction mixture, the reaction temperature, and the polycondensation time of the polysiloxane (A) were changed (as shown in Table 2).

The compounds corresponding to the abbreviations in Table 1 and Table 2 are as shown below.

| Abbreviation | Compound |
| --- | --- |
| (a-1-1) | bis-1,6-(trimethoxysilyl) hexane |
| (a-1-2) | 1,4-bis(trimethoxysilylmethyl)benzene |
| (a-1-3) | bis-1,2-(trimethoxysilyl) ethane |
| (a-2-1) | 3-(triethoxysilyl)propyl succinic anhydride |
| (a-2-2) | 3-(trimethoxysilyl)propyl glutaric anhydride |
| (a-2-3) | (dimethoxysilyl) di(ethyl succinic anhydride) |
| (a-2-4) | 2-oxetanylbutoxypropyltrimethoxysilane |
| (a-2-5) | 2-(3,4-epoxycyclohexyl)ethyltrimethoxysilane |
| (a-2-6) | 2-oxetanylbutoxypropyltriethoxysilane |
| (a-3-1) | methyltrimethoxysilane (MTMS) |
| (a-3-2) | dimethyldimethoxysilane (DMDMS) |
| (a-3-3) | phenyltrimethoxysilane (PTMS) |
| (a-3-4) | phenyltriethoxysilane (PTES) |
| (a-3-5) | silanol-terminated polysiloxane, product name: DMS-S27, made by Gelest Inc. |

-continued

| Abbreviation | Compound |
|---|---|
| PGEE | propylene glycol monoethyl ether |
| DAA | diacetone alcohol (i.e., 4-hydroxy-4-methyl-2-pentanone) |
| — | DI water |
| — | oxalic acid |

TABLE 1

| Reaction mixture | | Synthesis embodiment | | | | | | | |
|---|---|---|---|---|---|---|---|---|---|
| | | A-1-1 | A-1-2 | A-1-3 | A-1-4 | A-1-5 | A-1-6 | A-1-7 | A-1-8 |
| Silane monomer (a-1) (moles) | (a-1-1) | 0.1 | — | — | — | 1 | 5 | — | — |
| | (a-1-2) | — | 2 | — | 10 | 3 | — | 5 | — |
| | (a-1-3) | — | — | 5 | — | — | — | — | 5 |
| Silane monomer (a-2) (moles) | (a-2-1) | 10 | — | — | 5 | — | — | — | — |
| | (a-2-2) | — | 15 | — | 20 | — | 10 | — | — |
| | (a-2-3) | — | — | — | — | — | — | 5 | — |
| | (a-2-4) | — | — | 30 | — | — | — | — | 5 |
| | (a-2-5) | — | — | — | — | — | — | — | 10 |
| | (a-2-6) | — | — | — | — | 1 | 5 | — | — |
| Silicon-containing compound (a-3) (moles) | (a-3-1) | 40 | 30 | — | — | 55 | 20 | — | 20 |
| | (a-3-2) | — | — | 20 | 50 | — | — | 40 | — |
| | (a-3-3) | 45 | — | — | 15 | 40 | 60 | — | — |
| | (a-3-4) | — | 53 | 45 | — | — | — | 50 | 30 |
| | (a-3-5) | 4.9 | — | — | — | — | — | — | — |
| Solvent (g) | PGEE | 200 | 100 | 200 | 200 | 200 | 200 | 200 | 200 |
| | DAA | — | 100 | — | — | — | — | — | — |
| Catalyst (g) | DI water | 75 | 75 | 75 | 75 | 75 | 75 | 75 | 75 |
| | oxalic acid | 0.4 | 0.4 | 0.35 | 0.45 | 0.4 | 0.4 | 0.4 | 0.4 |
| Reaction temperature (° C.) | | 105 | 110 | 105 | 110 | 105 | 105 | 105 | 105 |
| Polycondensation time (hours) | | 6 | 5 | 6 | 6 | 6 | 6 | 6 | 5 |

TABLE 2

| Reaction mixture | | Comparative synthesis embodiment | | |
|---|---|---|---|---|
| | | A-2-1 | A-2-2 | A-2-3 |
| Silane monomer (a-1) (moles) | (a-1-1) | — | — | — |
| | (a-1-2) | — | 5 | — |
| | (a-1-3) | — | — | — |
| Silane monomer (a-2) (moles) | (a-2-1) | — | — | — |
| | (a-2-2) | — | — | — |
| | (a-2-3) | — | — | — |
| | (a-2-4) | 10 | — | — |
| | (a-2-5) | — | — | — |
| | (a-2-6) | — | — | — |
| Silicon-containing compound (a-3) (moles) | (a-3-1) | — | 40 | 40 |
| | (a-3-2) | 40 | 10 | — |
| | (a-3-3) | 30 | — | — |
| | (a-3-4) | 10 | 45 | 59 |
| | (a-3-5) | — | — | 1 |
| Solvent (g) | PGEE | 150 | 200 | 100 |
| | DAA | 50 | — | 100 |
| Catalyst (g) | DI water | 75 | 75 | 75 |
| | oxalic acid | 0.4 | 0.4 | 0.35 |
| Reaction temperature (° C.) | | 105 | 110 | 105 |
| Polycondensation time (hours) | | 5 | 6 | 5 |

EXAMPLES AND COMPARATIVE EXAMPLES OF PHOTOSENSITIVE COMPOSITION

Example 1 to example 10 and comparative example 1 to comparative example 4 of the photosensitive composition are described below:

Example 1

100 parts by weight of the polysiloxane A-1-1, 10 parts by weight of o-naphthoquinonediazidesulfonate (B–1) (product name: DPAP200, made by DKC, average degree of esterification: 67%) formed by 1-[1-(4-hydroxyphenyl)isopropyl)-4-(1,1-bis(4-hydroxyphenyl)ethyl)benzene and o-naphthoquinonediazide-5-sulfonic acid were added to 300 parts by weight of propylene glycol monomethyl ether acetate (C-1) and 200 parts by weight of diacetone alcohol (C-2). The photosensitive composition of example 1 was obtained after the mixture was uniformly stirred with a shaking-type stirrer. The photosensitive composition of example 1 was evaluated with the evaluation methods below, and the results thereof are as shown in Table 3.

Example 2 to Example 10

The photosensitive composition of each of example 2 to example 10 was prepared by the same steps as example 1, and the difference thereof is: the type and the usage amount of each component were changed, as shown in Table 3. The photosensitive composition of each of examples 2 to 10 was evaluated with the evaluation methods below, and the results thereof are as shown in Table 3.

Comparative Example 1 to Comparative Example 4

The photosensitive composition of each of comparative example 1 to comparative example 4 was prepared by the same steps as example 1, and the difference thereof is: the type and the usage amount of each component were changed, as shown in Table 4. The photosensitive composition of each of comparative example 1 to comparative example 4 was evaluated with each evaluation method below, and the results thereof are as shown in Table 4.

The compounds corresponding to the abbreviations in Table 3 and Table 4 are as shown below.

| Abbreviation | Compound |
|---|---|
| B-1 | o-naphthoquinonediazidesulfonate formed by 1-[1-(4-hydroxyphenyl)isopropyl]-4-[1,1-bis(4-hydroxyphenyl)ethyl]benzene and o-naphthoquinonediazide-5-sulfonic acid |
| B-2 | o-naphthoquinonediazidesulfonate formed by 2,3,4-trihydroxybenzophenone and o-naphthoquinonediazide-5-sulfonic acid |
| C-1 | propylene glycol monomethyl ether acetate (PGMEA) |
| C-2 | diacetone alcohol (i.e., 4-hydroxy-4-methyl-2-pentanone) |
| C-3 | cyclohexanone |
| D-1 | SF-8427 (made by Dow Corning Toray Co., Ltd., surfactant) |
| D-2 | 3-glycidoxypropyltrimethoxysilane (product name KBM403, made by Shin-Etsu Chemical Co., Ltd., adhesion auxiliary agent) |
| D-3 | bis-1,6-(trimethoxysilyl) hexane |

[Evaluation Methods]

Chemical Resistance

The photosensitive composition of each example and comparative example was coated on a glass substrate having a size of 100×100×0.7 mm$^3$ with a method of spin coating to form a coating film having a thickness of about 2 μm. Next, the coating film was pre-baked at 110° C. for 2 minutes to form a pre-baked coating film. Then, a suitable photomask was disposed between an exposure machine and the pre-baked coating film, and patterning exposure was performed on the pre-baked coating film with 100 mJ/cm$^2$ of ultraviolet light (model of exposure machine: AG500-4N, made by M&R Nano Technology). Then, the substrate having the exposed pre-baked coating film thereon was developed with a 2.38% aqueous solution of tetramethyl-ammonium hydroxide (TMAH) at 23° C. for 1 minute to remove the exposed portion of the coating film on the glass substrate. Next, the glass substrate was rinsed with water. Then, the exposed and developed pre-baked coating film was irradiated by 200mJ/cm$^2$ of energy with the exposure machine. Next, the pre-baked coating film was post-baked in an oven at 230° C. for 60 minutes to four a post-baked coating film. Then, the post-baked coating film was immersed in an N-methylpyrrolidone solution at 60° C. for 6 minutes.

The change in film thickness (calculated as THC (%)) between the film thickness (calculated as TH1) before immersion in the N-methylpyrrolidone solution at 60° C. and the film thickness (calculated as TH2) after immersion in the N-methylpyrrolidone solution at 60° C. was calculated with formula (7) to obtain the rate of change of film thickness. A lower absolute value of the rate of change of film thickness represents better chemical resistance.

$$THC(\%) = \frac{TH1 - TH2}{TH1} \times 100\% \quad \text{formula (7)}$$

The evaluation criteria of the rate of change of film thickness are as shown below.

TABLE 3

| Component | | Example 1 | 2 | 3 | 4 | 5 | 6 | 7 | 8 | 9 | 10 |
|---|---|---|---|---|---|---|---|---|---|---|---|
| polysiloxane polymer (A) | A-1-1 | 100 | — | — | — | — | — | — | — | — | — |
| (parts by weight) | A-1-2 | — | 100 | — | — | — | — | — | — | 50 | — |
| | A-1-3 | — | — | 100 | — | — | — | — | — | — | 30 |
| | A-1-4 | — | — | — | 100 | — | — | — | — | 50 | — |
| | A-1-5 | — | — | — | — | 100 | — | — | — | — | 70 |
| | A-1-6 | — | — | — | — | — | 100 | — | — | — | — |
| | A-1-7 | — | — | — | — | — | — | 100 | — | — | — |
| | A-1-8 | — | — | — | — | — | — | — | 100 | — | — |
| | A-2-1 | — | — | — | — | — | — | — | — | — | — |
| | A-2-2 | — | — | — | — | — | — | — | — | — | — |
| | A-2-3 | — | — | — | — | — | — | — | — | — | — |
| o-naphthoquinonediazidesulfonate | B-1 | 10 | 5 | 10 | — | 25 | 15 | 15 | — | — | 20 |
| (B) (parts by weight) | B-2 | — | — | 5 | 20 | 5 | — | — | 15 | 15 | — |
| Solvent (C) (parts by weight) | C-1 | 300 | 200 | 300 | 500 | 1000 | — | 500 | — | 400 | 500 |
| | C-2 | 200 | — | 200 | — | — | 600 | — | 500 | — | — |
| | C-3 | — | — | 100 | — | 200 | — | — | — | 400 | — |
| Additive (D) (parts by weight) | D-1 | — | 0.1 | — | — | — | — | — | — | — | — |
| | D-2 | — | — | — | — | 1 | — | — | — | 2 | — |
| | D-3 | — | — | — | — | — | — | — | — | — | — |
| Evaluation method | Chemical resistance | ○ | ○ | ○ | ○ | ○ | ○ | ○ | ○ | ○ | ○ |

TABLE 4

| Component | | Comparative example 1 | 2 | 3 | 4 |
|---|---|---|---|---|---|
| polysiloxane polymer (A) | A-1-1 | — | — | — | — |
| (parts by weight) | A-1-2 | — | — | — | — |
| | A-1-3 | — | — | — | — |
| | A-1-4 | — | — | — | — |
| | A-1-5 | — | — | — | — |
| | A-1-6 | — | — | — | — |
| | A-1-7 | — | — | — | — |
| | A-1-8 | — | — | — | — |
| | A-2-1 | 100 | — | — | 100 |
| | A-2-2 | — | 100 | — | — |
| | A-2-3 | — | — | 100 | — |
| o-naphthoquinonediazide-sulfonate (B) (parts by weight) | B-1 | 20 | 15 | 10 | 20 |
| | B-2 | — | — | 5 | — |
| Solvent (C) (parts by weight) | C-1 | 600 | — | 500 | 600 |
| | C-2 | — | 300 | — | — |
| | C-3 | — | 300 | — | — |
| Additive (D) (parts by weight) | D-1 | — | — | — | — |
| | D-2 | — | — | — | — |
| | D-3 | — | — | — | 15 |
| Evaluation method | Chemical resistance | X | X | X | X |

☐: −3%≦THC≦3%.
○: −5%≦THC<−3% or 3%<THC≦5%.
X: THC<−5% or 5%<THC.

<Evaluation Results>

It can be known from Table 3 and Table 4 that, in comparison to photosensitive compositions containing the polysiloxane (A) obtained by polycondensing the reaction mixture of the silane monomer (a-1), the silane monomer (a-2), and the silicon-containing compound (a-3) (example 1 to example 10), the chemical resistance of the protective films formed by the photosensitive compositions in which the polysiloxane (A) formed by the reaction mixture not containing the silane monomer (a-1) (comparative examples 1, 3, and 4), or the silane monomer (a-2) (comparative examples 2 and 3) is poor.

Based on the above, since the photosensitive composition of the invention contains the polysiloxane (A) formed by a specific monomer, when applied in a protective film, the protective film has better chemical resistance. Therefore, the photosensitive composition of the invention is suitable for a protective film.

Although the invention has been described with reference to the above embodiments, it will be apparent to one of the ordinary skill in the art that modifications to the described embodiments may be made without departing from the spirit of the invention. Accordingly, the scope of the invention is defined by the attached claims not by the above detailed descriptions.

What is claimed is:

1. A photosensitive composition, comprising:
a polysiloxane (A);
an o-naphthoquinonediazidesulfonate (B); and
a solvent (C),
wherein the polysiloxane (A) is obtained by polycondensing a mixture, wherein the mixture comprises a silane monomer (a-1) represented by formula (1), a silane monomer (a-2) represented by formula (2), and a silicon-containing compound (a-3), (R$^1$O)$_3$Si—R$^2$—Si(OR$^3$)$_3$  formula (1)

in formula (1), R$^1$ and R$^3$ each independently represent a C$_1$ to C$_4$ alkyl group; R$^2$ represents a C$_1$ to C$_6$ alkylene group, a phenylene group, or a group represented by formula (1-1),

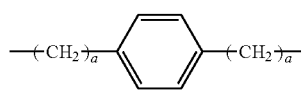

formula (1-1)

in formula (1-1), a each independently represents an integer of 1 to 4,

Si(R$^4$)$_b$(OR$^5$)$_{4-b}$  formula (2)

in formula (2), R$^4$ each independently represents a hydrogen atom, a C$_1$ to C$_{10}$ alkyl group, a C$_2$ to C$_{10}$ alkenyl group, a C$_6$ to C$_{15}$ aromatic group, an acid anhydride group-containing alkyl group, an epoxy group-containing alkyl group, or an epoxy group-containing alkoxy group; R$^5$ each independently represents a hydrogen atom, a C$_1$ to C$_6$ alkyl group, a C$_1$ to C$_6$ acyl group, or a C$_6$ to C$_{15}$ aromatic group; b represents an integer of 1 to 3, and R$^4$ contains at least one of the acid anhydride group-containing alkyl group, the epoxy group-containing alkyl group, or the epoxy group-containing alkoxy group, the silicon-containing compound (a-3) is selected from the group consisting of a silane monomer represented by formula (3) and a siloxane prepolymer, Si(R$^6$)$_c$(OR$^7$)$_{4-c}$  formula (3)

in formula (3), R$^6$ each independently represents a hydrogen atom, a C$_1$ to C$_{10}$ alkyl group, a C$_2$ to C$_{10}$ alkenyl group, or a C$_6$ to C$_{15}$ aromatic group; R$^7$ each independently represents a hydrogen atom, a C$_1$ to C$_6$ alkyl group, a C$_1$ to C$_6$ acyl group, or a C$_6$ to C$_{15}$ aromatic group; and c represents an integer of 0 to 3, and wherein in a sum of moles of the silane monomer (a-1), the silane monomer (a-2) and the silicon-containing compound (a-3) being 100 mol %, an amount of the silane monomer (a-1) is 0.1 mol % to 10 mol %, an amount of the silane monomer (a-2) is 1 mol % to 30 mol %, and a amount of the silicon-containing compound (a-3) is 65 mol % to 95 mol %.

2. The photosensitive composition of claim 1, wherein based on a usage amount of 100 parts by weight of the polysiloxane (A), a usage amount of the o-naphthoquinonediazidesulfonate (B) is 5 parts by weight to 30 parts by weight, and a usage amount of the solvent (C) is 200 parts by weight to 1200 parts by weight.

3. A protective film, comprising the photosensitive composition of claim 1.

4. An element having a protective film, comprising an element and the protective film of claim 3, wherein the protective film covers the element.

* * * * *